United States Patent
Stearns et al.

(10) Patent No.: US 6,277,347 B1
(45) Date of Patent: Aug. 21, 2001

(54) USE OF OZONE IN PROCESS EFFLUENT ABATEMENT

(75) Inventors: Ranald Stearns, Los Altos; Gary Sypherd, Milpitas; Stuardo Robles, Sunnyvale, all of CA (US); Maria Galiano, Fishkill, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/805,989

(22) Filed: Feb. 24, 1997

(51) Int. Cl.[7] .................................................... C01B 7/00
(52) U.S. Cl. .................. 423/240 R; 423/245.3; 423/235; 204/157.13; 422/186
(58) Field of Search .............. 423/240 R, 245.3, 423/235; 204/157.13; 422/186; 134/1.2, 1.3

(56) References Cited

U.S. PATENT DOCUMENTS

| | | | |
|---|---|---|---|
| 4,793,931 | 12/1988 | Stevens et al. | 210/636 |
| 4,872,947 | * 10/1989 | Wang et al. | 204/192.37 |
| 5,281,302 | * 1/1994 | Gabric et al. | 134/1 |
| 5,417,826 | * 5/1995 | Blalock | 204/157.15 |
| 5,430,228 | 7/1995 | Ciambrone et al. | 588/200 |
| 5,451,378 | * 9/1995 | Russell et al. | 422/186 |
| 5,453,125 | 9/1995 | Krogh | 118/723 MR |
| 5,478,532 | * 12/1995 | Uhm | 422/186 |
| 5,663,476 | * 9/1997 | Cripe et al. | 423/659 |

FOREIGN PATENT DOCUMENTS

| | | | |
|---|---|---|---|
| 360941 | * 4/1990 | (EP) | 423/240 R |
| 51-011068 | * 1/1976 | (JP) . | |
| 3-021325 | * 1/1991 | (JP) | 423/240 R |
| 3-051611 | * 3/1991 | (JP) | 423/240 R |

OTHER PUBLICATIONS

Rosemount Analytical's Product Brochure for the NGA 2000, No Date Given.

* cited by examiner

Primary Examiner—Tom Dunn
(74) Attorney, Agent, or Firm—Townsend and Townsend and Crew

(57) ABSTRACT

A method and apparatus for abating a compound in a substrate processing system's effluent gases. The method of the present invention begins by introducing ozone and the effluent gases into an abatement device's combustion chamber. Energy is then applied to the effluent gas and ozone. The application of energy, such as thermal or radio frequency energy, then causes a reaction in and between the effluent gases and the ozone, thereby rendering the compound inert. The resultant gases produced are then exhausted out of the combustion chamber.

27 Claims, 5 Drawing Sheets

USE OF OZONE IN PROCESS EFFLUENT ABATEMENT

BACKGROUND OF THE INVENTION

The present invention relates to the abatement of gaseous effluents created during semiconductor substrate processing. More specifically, the present invention relates to a method and apparatus for reducing effluent levels in the gaseous discharge of semiconductor substrate processing equipment by using ozone in the abatement process.

In recent years, the release of certain gaseous chemical compounds into the environment has become the subject of various laws and regulations administered by regulatory agencies such as the Environmental Protection Agency (EPA). Many of these compounds are monitored by agencies such as the EPA for potentially harmful effects on the environment.

The semiconductor industry is particularly affected by these concerns because of the numerous kinds of chemicals involved in the fabrication of integrated circuits. The release of chlorofluorocarbons (CFCs) and perfluorinated compounds such as $CF_4$, $C_2F_6$ and $NF_3$ (also called perfluorocarbons, or PFCs), which are used in semiconductor processing operations such as thin film etching, chemical vapor deposition (CVD) and the cleaning of processing chambers, among other operations, is regulated by the EPA. Also regulated is the release of nitrogen oxide ($NO_X$) compounds, which may be emitted by certain semiconductor processing systems.

Illustrated in FIG. 1 is a substrate processing system 100 of the prior art capable of carrying out one or more processes that may discharge such effluent gases, such as CFCs, PFCs, nitrogen oxides and ozone (e.g., a CVD system). The process gases required for the process being performed are introduced into a processing chamber 105 via process gas lines 110(1)–(M). These process gases are then energized (e.g., thermally or by radio-frequency (RF) energy), to promote reactions that form the desired layer(s) on one or more substrates (not shown) disposed within processing chamber 105. The CFCs, PFCs, nitrogen oxides and other effluent gases generated by these reactions, along with unreacted portions of the process gases, are removed from processing chamber 105 by a vacuum pump (not shown) and are exhausted through effluent line 120 into an abatement device 130. Optionally, one or more combustion fuels may be introduced into a combustion chamber (not shown) of abatement device 130 via combustion fuel lines 140(1)–(N). In the combustion chamber, chemical reactions occur between the effluent gases and optional combustion fuels.

One technique commonly used in the abatement of effluent gases is thermal abatement. Thermal abatement devices use thermal energy sources such as an open flame or electric arc to promote the chemical reactions that convert the undesirable compounds into less volatile, environmentally safer compounds. If a thermal abatement technique is employed, various combustion fuels may be introduced into the combustion chamber along with the effluent gases to further promote the decomposition of undesirable compounds. Which combustion fuels are used, if any, depends on the abatement technique employed. Combustion fuels such as oxygen-containing gases (e.g., oxygen or air) and hydrogen are often employed due to their reactivity and the high heat produced by their reactions with each other and various effluent gases.

Another common abatement technique is the use of RF energy to dissociate compounds within the effluent gas stream. An example of this is a plasma technique in which a plasma is formed from effluent gases introduced into the combustion chamber. This ionization promotes decomposition of undesirable compounds within the effluent gases, converting them into safer, more tractable compounds.

Regardless of the abatement technique employed, energy is applied to the effluent gases and optional combustion fuels to promote combustion. The by-products of the abatement reactions are then exhausted along with any unreacted gases. Depending upon the configuration, more abatement operations may be performed to further reduce levels of undesirable compounds within the exhaust gases, using methods such as water scrubbing, catalysis and filtering. For example, FIG. 1 shows abatement device 130 connected to a water scrubber 150. In water scrubbing, effluent gases are brought into contact with water, using methods such as bubbling the effluent gases through the water, sending the effluent gases through a water spray or the like. Certain of the effluent gases then react with the water, forming inert or, at least, less hazardous compounds. Alternatively, the exhaust gases may be discharged directly into the atmosphere. However, regardless of the abatement technique employed, several types of compounds in an effluent gas stream may not be abated sufficiently using traditional techniques. This is particularly true of PFCs. Moreover, newer methods capable of abating these compounds such as plasma abatement are often expensive and require large amounts of energy.

As illustrated in FIG. 1, substrate processing system 100 may also include an ozone generator 160 that generates ozone ($O_3$) for use in some substrate processing operations. For example, substrate processing system 100 might be capable of depositing a silicon oxide film ($SiO_X$). Such a film may be deposited at atmospheric pressure and at a temperature as low as 250° C. by reacting tetraethylorthosilicate ($Si(C_2H_5O)_4$), also called tetraethoxysilane (TEOS), with ozone. TEOS/ozone silicon oxide films are desirable because they exhibit smooth oxide profiles over steps, good filling of high aspect-ratio gaps (i.e., gaps with a high depth-to-width ratio) and desirable electrical characteristics. A TEOS/ozone process is suitable for depositing silicon oxide films for applications such as intermetal dielectrics. The thermal reaction that takes place between TEOS and ozone is given by:

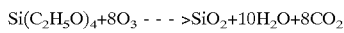

$$Si(C_2H_5O)_4 + 8O_3 \text{ - - - >} SiO_2 + 10H_2O + 8CO_2$$

Ozone generator 160 may use any one of several ozone generation techniques. For example, ozone generator 160 might use an electric arc technique, generating ozone by passing an oxygen-containing gas through an electric arc. An example of an ozone generation system employing this method is AX8200A from Astex, Inc., of Woburn, Mass. Normally, in processes such as the TEOS/ozone process described above, ozone is generated continuously throughout operation of the chamber to maintain stable process parameters and flow rates, rather than simply shutting down ozone generator 160.

Thus, ozone is directed to processing chamber 105 when the process being performed requires ozone. However, when the process being performed does not require ozone or when a substrate is not being processed (e.g., while a substrate is being transferred into or out of the chamber or during the cleaning of processing chamber 105), a bypass valve 170 directs the unused ozone through a bypass line 180 that feeds into an ozone abatement device 190. Ozone abatement device 190 normally renders ozone inert by converting the ozone into oxygen. Such conversion methods include thermal abatement, ultraviolet (UV) catalysis (in which the ozone is photolytically decomposed) and chemical catalysis (in which ozone is chemically decomposed by reaction with a compound such as manganese dioxide ($MnO_2$)).

As is evident from the above, it is desirable, from both a regulatory and an environmental perspective, to reduce or eliminate the effluents emitted by substrate processing equipment, such as CFCs, PFCs, nitrogen oxides and ozone. It is also desirable to provide more effective abatement of these compounds using the facilities already available in certain substrate processing systems. Moreover, it is desirable to increase abatement efficiency, in terms of power and fuel consumed in the abatement process.

Aside from its use in processing substrates, ozone has also found use in the abatement of various toxic or undesirable chemicals. For example, ozone has been employed in the destruction of certain chemical weapons, combining with the lethal chemical components to render them inert. Ozone has also been used to decontaminate soil containing solid or liquid wastes, when such wastes include organic contaminants amenable to photodegradation. However, ozone has not been used in the abatement of the effluent gases generated by substrate processing systems.

SUMMARY OF THE INVENTION

The present invention solves the above problems of the prior art by providing a method and apparatus that employs ozone to abate effluents such as CFCs, PFCs and nitrogen oxides exhausted from a substrate processing system. The introduction of ozone provides more efficient abatement of such effluents than previous solutions.

According to the method of the present invention, a process for abating a compound in a substrate processing system's effluent gases begins by introducing ozone and the effluent gases into an abatement device's combustion chamber. Energy is then applied to the effluent gases and ozone to render the compound inert. The application of energy promotes a reaction in and between the effluent gases and the ozone, thereby producing resultant gases that are exhausted out of the combustion chamber. In a preferred embodiment, the method of the present invention employs thermal energy to promote the reaction between the ozone and the effluent gases. Alternatively, RF energy may be applied to abate such compounds by creating a plasma from the effluent gases and ozone.

The method of the present invention is particularly beneficial when employed in systems that already include an ozone generator to generate ozone for use as a process gas. Such systems may be modified to take advantage of the method of the present invention. Rather than shunt excess ozone provided by the ozone generator to a dedicated ozone abatement device, the excess ozone may be used instead to abate effluent gases from the system by directing the excess ozone to the abatement device for the effluent gases. This obviates the need to abate the ozone separately and improves the abatement of the other effluent gases generated by the system.

Another aspect of the present invention is a substrate processing system which includes an effluent gas abatement system that uses ozone to help abate a compound in effluent gases generated during the substrate processing system's operation. The substrate processing system includes a substrate processing chamber having a first outlet for exhausting effluent gases; an abatement unit coupled to the first outlet of the substrate processing system; and an ozone source. An outlet of the ozone source is coupled to the abatement unit so that ozone is provided to the abatement unit to improve effluent gas abatement. An ignition device may also be provided to create and maintain a reaction in and between the effluent gases, ozone and other optional combustion fuels to render the compound inert. In a substrate processing system which already includes an ozone source (e.g., an ozone generator), that ozone source is preferably connected to the abatement unit rather than connecting a separate ozone abatement unit.

A further understanding of the nature and advantages of the present invention may be realized by reference to the remaining portions of the specification and the drawings.

DETAILED DESCRIPTION OF THE PREFERRED EMBODIMENTS

I. Introduction

The method of the present invention enhances abatement of certain undesirable compounds in effluent gases generated during the operation of a substrate processing system by introducing ozone into the abatement process. In a preferred embodiment of the present invention, ozone is introduced upstream of or directly into an abatement device. The abatement technique of the present invention may be practiced with any substrate processing system that uses or generates compounds such as CFCs, PFCs, nitrogen oxides and the like. In systems that employ ozone in the processing of substrates, ozone not used in processing can be used to practice the method of the present invention, thereby increasing abatement efficiency and obviating the need for separate ozone abatement equipment.

II. An Exemplary CVD System

Figure 2:
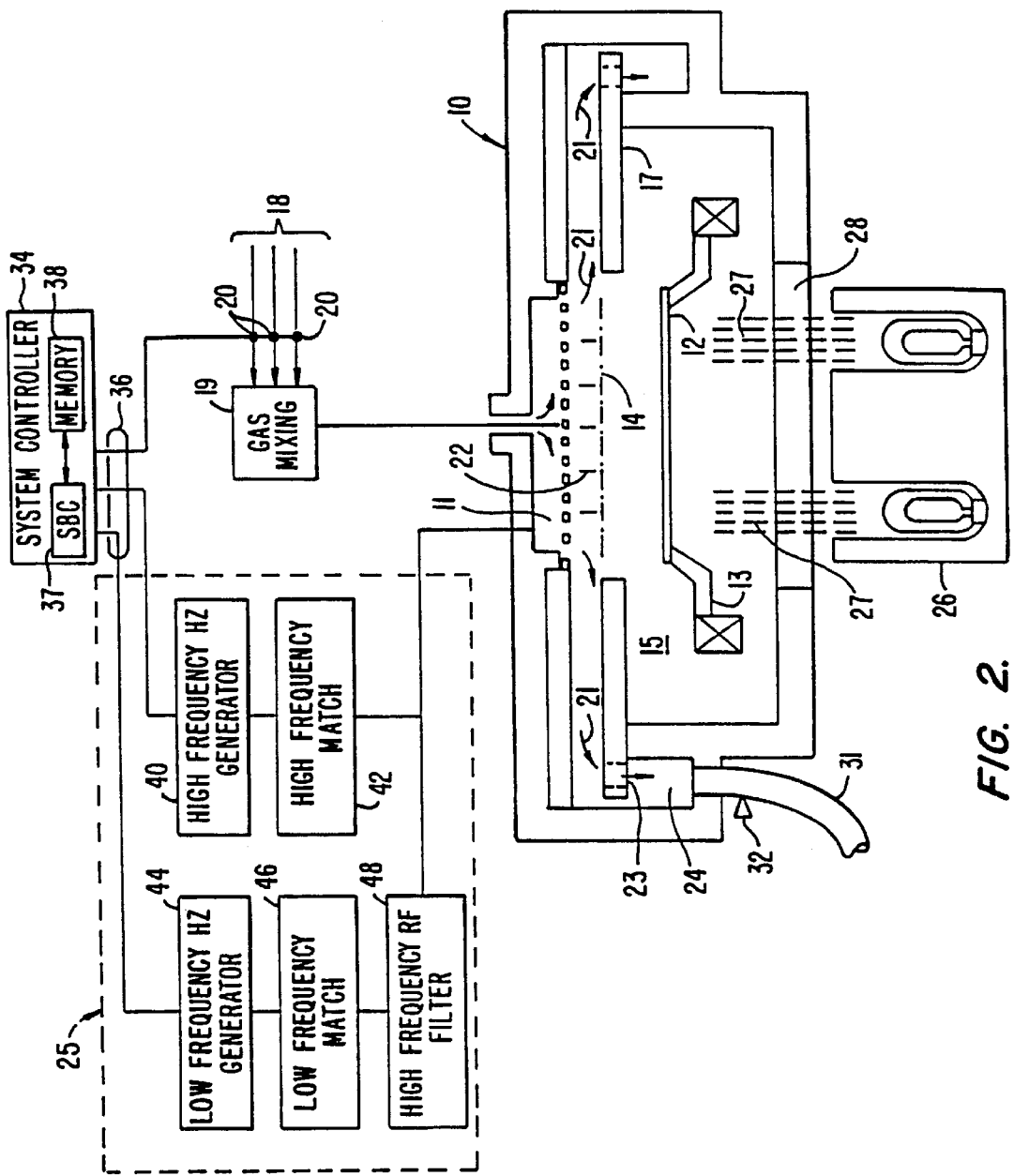
FIG. 2 is a vertical, cross-sectional view of one embodiment of a simplified chemical vapor deposition (CVD) apparatus capable of generating the effluent gases which may be abated according to the present invention.

One suitable CVD system, for which the method of the present invention can be used to abate effluent gases, is shown in FIG. 2, which is a vertical cross-sectioned view of a simplified, parallel-plate plasma-enhanced chemical vapor deposition (PECVD) system 10 having a vacuum chamber 15. CVD system 10 contains a gas distribution manifold 11 for dispersing process gases through perforated holes in manifold 11 to a wafer (not shown) that rests on a susceptor 12. Susceptor 12 is highly heat responsive and is mounted on supports 13 so that susceptor 12 (and the wafer supported on the upper surface of susceptor 12) can be moved controllably between a lower loading/off-loading position and an upper processing position 14 that is closely adjacent to manifold 11. A center board (not shown) includes sensors for providing information on the position of the wafer.

When susceptor 12 and the wafer are in processing position 14, they are surrounded by a baffle plate 17 having a plurality of spaced holes 23 that exhaust into an annular vacuum manifold 24. Deposition and carrier gases are supplied through supply lines 18 into a mixing system 19, where they are combined and then sent to manifold 11. Generally, supply lines 18 for each of the process gases include (I) safety shut-off valves (not shown) that can be used to automatically or manually shut off the flow of process gas into the chamber, and (ii) mass flow controllers 20 that measure the flow of gas or liquid through the supply lines. When toxic gases are used in the process, the several safety shut-off valves are positioned on each gas supply line in conventional configurations. The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the wafer in a laminar flow as indicated by arrows 21. An exhaust system exhausts effluent gas, which includes unreacted process gases and products and by-products of the reactions, via ports 23 into the circular vacuum manifold 24 and out an exhaust line 31 by a vacuum pump system (not shown). The rate at which effluent gases are released through exhaust line 31 is controlled by a throttle valve 32.

The deposition process performed in CVD system 10 can be either a thermal process or a plasma-enhanced process. In a plasma process, a controlled plasma is formed adjacent to the wafer by RF energy applied to manifold 11 from RF power supply 25. Manifold 11 is also an RF electrode, whereas susceptor 12 is grounded. RF power supply 25 can supply either single or mixed frequency RF power (or other desired variation) to manifold 11 to enhance the decomposition of reactive species introduced into chamber 15. The mixed frequency RF power is generated by a high frequency RF generator 40 (RF1) and corresponding match circuit 42, and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular peripheral portion of susceptor 12. Such heat distribution compensates for the natural heat loss pattern of the susceptor and provides rapid and uniform heating of the susceptor and wafer for effecting deposition.

Typically, any or all of the chamber lining, gas distribution manifold faceplate, supports 13 and various other reactor hardware are made out of material such as aluminum or anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Chang et al. and assigned to Applied Materials, Inc., the assignee of the present invention, which is incorporated herein by reference for all purposes.

A motor (not shown) raises and lowers susceptor 12 between a processing position 14 and a lower, wafer-loading position. Motors and optical sensors are used to move and determine the position of movable mechanical assemblies such as throttle valve 32 and susceptor 12. The heater, motors, valves or flow controllers 20 connected to supply lines 18, gas delivery system, throttle valve 32, RF power supply 25 and lamp magnet drivers are all controlled by a system controller 34 over control lines 36 of which only some are shown.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position and other parameters of a particular process. Of course, other computer programs such as one stored on another memory device including, for example, a floppy disk or other another appropriate drive, may also be used to operate processor 34.

In a preferred embodiment, the system controller includes a hard disk drive (memory 38), a floppy disk drive and a card rack. The card rack contains a single board computer (SBC) processor 37, analog and digital input/output boards, interface boards and stepper motor controller boards. Various parts of CVD system 10 conform to the Versa Modular European (VME) standard, which defines board, card cage and connector dimensions and types. The VME standard also defines the bus structure having a 16-bit data bus and 24-bit address bus.

The above description is mainly for illustrative purposes and should not be considered as limiting the scope of the present invention. Variations of the above described system such as variations in supporter design, heater design, location of RF power connections and other variations are possible. Additionally, other types of substrate processing equipment normally produce such effluent gases during cleaning (usually done with a fluorine-containing compound, giving rise to CFC and PFC emissions) and other processes, and so may benefit from the method of the present invention. For example, other CVD equipment, such as electron cyclotron resonance (ECR) plasma CVD equipment, induction-coupled RF high-density plasma CVD (HDP-CVD) equipment, sub-atmospheric CVD (SACVD) equipment, atmospheric CVD (APCVD) equipment and the like produce such effluents. An abatement system according to the present invention may also be used to abate effluents generated by these CVD systems and by other substrate processing equipment such as certain etching and diffusion equipment. The abatement of effluent gases according to the present invention is not limited to any specific substrate processing system or method.

III. Ozone-Enhanced Abatement of Undesirable Compounds in Effluent Gases

The method of the present invention introduces ozone into an effluent stream exhausted from a substrate processing chamber, such as the exemplary chamber described above, to provide more complete and more efficient abatement of undesirable compounds (e.g., CFCs and PFCs) in the effluent stream. Other combustion fuels such as hydrogen and oxygen (e.g., air) can also be added to further aid the abatement process.

The present invention is particularly advantageous in systems that include an ozone generator. In such a case, the generator may serve as the source of ozone for the abatement process. This arrangement has the additional benefit of obviating the need for separate ozone abatement equipment. Details of two different substrate processing systems that utilize the present invention are described below.

Figure 3:
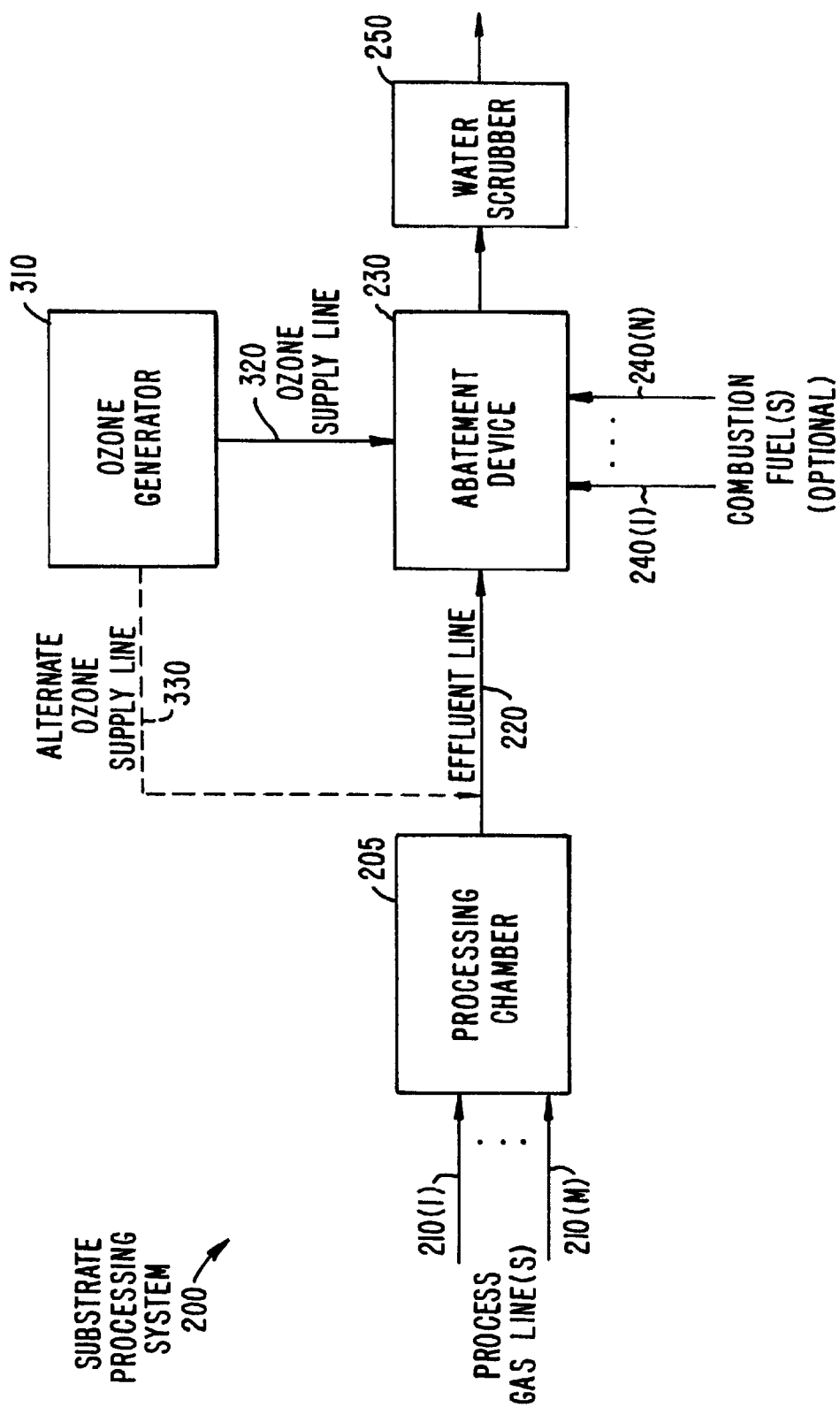
FIG. 3 is a block diagram of a substrate processing system employing a first embodiment of the method of the present invention to abate undesirable compounds in an effluent gas stream.

A. Ozone-Enhanced Abatement in Systems that Do No Use Ozone for Substrate Processing FIG. 3 shows a first embodiment of a substrate processing system 200, which does not employ ozone during the processing of substrates. The required process gases are introduced into a processing chamber 205 via process gas lines 210(1)–(M). These process gases are then energized to promote reactions that form the desired layer(s) on one or more substrates (not shown) disposed within processing chamber 205. The process gases may be energized by any one of a number of methods, including but not limited to thermal, RF plasma, direct-current plasma and inductively coupled plasma techniques. The effluent gases thus generated are exhausted through effluent line 220 into an abatement device 230. Optionally, one or more combustion fuels may be introduced into a combustion chamber (not shown) of abatement device 230 via combustion fuel lines 240(1)–(N).

Figure 1:
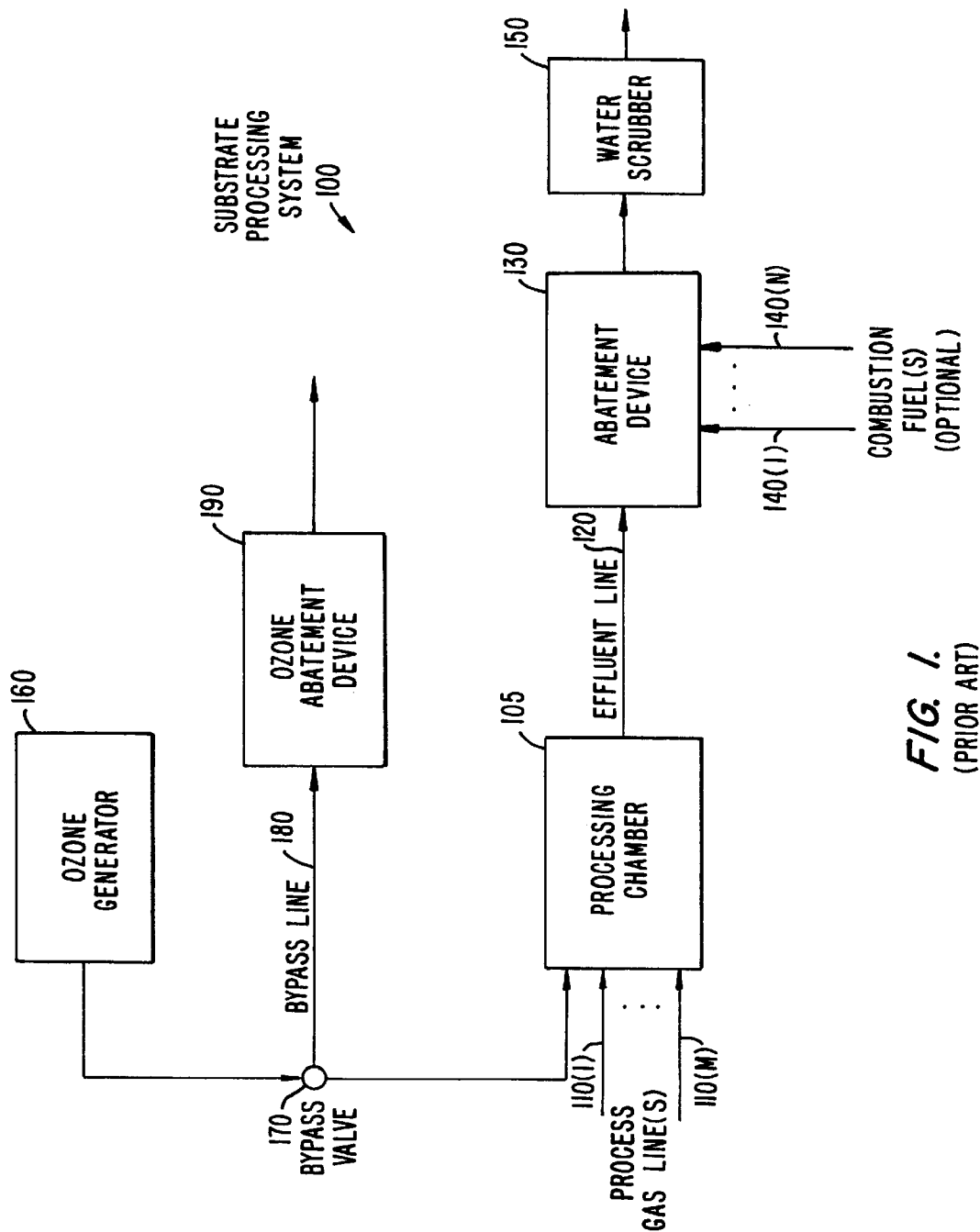
FIG. 1 is a block diagram of a substrate processing system of the prior art.

As shown in FIG. 3, substrate processing system 200 does not include ozone generator 160, ozone abatement device 190 or their associated gas delivery lines, as shown in FIG. 1. Instead, an ozone generator 310 supplies ozone to an abatement device 230 via an ozone supply line 320. In this configuration, ozone is introduced directly into a combustion chamber (not shown) of abatement device 230. Alternatively, ozone may be supplied to abatement device 230 via an alternative ozone supply line 330, which introduces the ozone upstream of the combustion chamber. Alternative ozone supply line 330 should not be used, however, if the substrate processing operations employ precursors requiring ozone, such as those which use silane or deposit nitrides. Otherwise, the ozone introduced via alternative ozone supply line 330 may react with unreacted precursors, forming residues which could clog effluent line 220.

The gaseous mixture then flows into the combustion chamber, where energy is applied to promote reactions in and between the effluent gases, ozone and optional combustion fuels. These reactions are believed to convert CFCs, PFCs and other undesirable compounds in the effluent gases into inert or less hazardous compounds. The by-products of these abatement reactions are then exhausted along with any unreacted gases. Depending upon the configuration, additional abatement operations may be performed to further reduce levels of undesirable compounds within the exhaust gases, using methods such as water scrubbing, catalysis and filtering. For example, FIG. 3 shows abatement device 230 connected to a water scrubber 250. Alternatively, the output of abatement device 230 may simply be exhausted into the atmosphere.

In a preferred embodiment, abatement device 230 is a thermal abatement device. An open-flame thermal abatement device (known colloquially as a "burn-box") is preferable because such an abatement technique is in common use, employs relatively inexpensive equipment and benefits the most from the method of the present invention, both in terms of thoroughness and abatement efficiency. Such an abatement device is preferably operated at combustion chamber temperatures of between about 300° C. and 900° C. In other embodiments, RF plasma, microwave, ECR, electric arc or other abatement methods may be employed.

Figure 4:
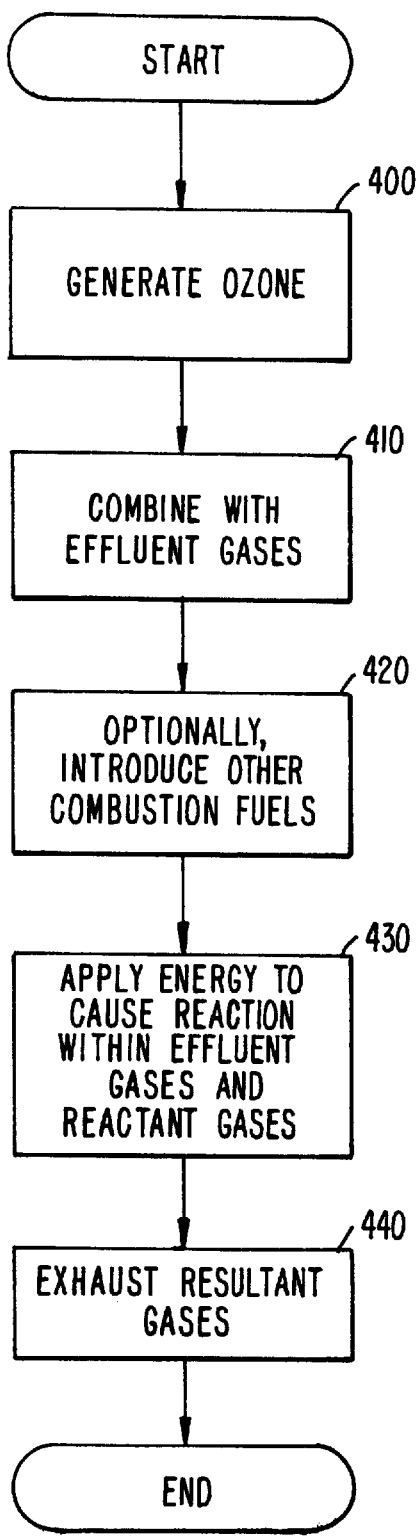
FIG. 4 is a flow diagram illustrating steps undertaken in abating gaseous effluents using ozone according to an embodiment of the process of the present invention.

The process performed by the apparatus illustrated in FIG. 3 is described in the flow diagram shown in FIG. 4. The description of the steps shown in FIG. 4 is made with reference to the components shown in FIG. 3. The process of abating effluent gases using ozone begins at step 400 where ozone is generated by ozone generator 310. At step 410, the ozone is combined with effluent gases. This may occur, as previously noted, in the combustion chamber of abatement device 230 or upstream of abatement device 230. Optionally, other combustion fuels (e.g., hydrogen) may also be introduced into the combustion chamber via combustion fuel lines 240(1)–(N) at step 420. In a thermal abatement process such as that described, the use of hydrogen as a combustion fuel is preferable. The use of hydrogen provides higher combustion temperatures and more stable by-products than other commonly used combustion fuels. For many processes, the use of ozone is believed to reduce the quantities of combustion fuels required during the abatement process, should combustion fuels be employed. Energy consumption is thought to be similarly reduced in abatement processes such as plasma abatement. As in a traditional abatement process, energy is then applied to promote a reaction within the effluent gases, ozone and optional combustion fuel gases at step 430. Finally, the by-products of these reactions, along with unreacted gases, are exhausted from abatement device 230 at step 440.

As previously discussed, the inclusion of ozone in the abatement process according to the method of the present invention is believed to be useful for abating CFCs, PFCs and nitrous oxide among other gases. For example, the abatement of PFCs (e.g., $C_2F_6$, $CF_4$, $CHF_3$, and $NF_3$), nitrogen oxides ($NO_X$ compounds, $N_2O$ and $N_XO_Y$ compounds), arsine ($AsH_3$), phosphine ($PH_3$) and carbon monoxide (CO) is thought to be improved by the inclusion of ozone in the abatement process. The reactions that occur during the abatement of such gases depend on the actual compound being abated, on the composition of other gases that may be present in the effluent gas stream and on the composition of other combustion fuels introduced into the abatement device. Hydrogen is believed to be a particularly useful combustion agent for the abatement of $C_2F_6$, $CF_4$, $CHF_3$ and $NF_3$ and other compounds.

The compounds listed above are for exemplary purposes only and are not intended to limit the scope of the claims. The method of the present invention is applicable in the abatement of other gases not listed and can also be used in the abatement of other toxic or otherwise undesirable substances. Again, certain of the products of the abatement process and certain unreacted intermediate compounds formed thereby may be removed by water scrubbing or similar techniques.

The use of ozone improves the abatement of compounds such as CFCs, PFCs and nitrogen oxides for several reasons. First, ozone's reactivity is greater than that of traditional combustion fuels such as oxygen, thereby further promoting chemical reactions. Second, the use of ozone promotes higher combustion temperatures, which lead to the improved combustion of effluent gases. This is particularly true where the combustion process employs hydrogen. The higher combustion temperatures fostered by this combination also translate into an abatement process having greater efficiency than abatement processes that do not employ ozone. In the preferred embodiment, hydrogen is also used to promote abatement reactions by further increasing combustion temperature.

The addition of ozone to the abatement process is also believed to provide other benefits. For example, due to ozone's higher reactivity, the consumption of combustion fuels such as hydrogen and the power levels required in plasma abatement devices may be reduced. The generation of ozone is also relatively a simple process and can use air, an oxygen/nitrogen mixture, pure oxygen or other oxygen compounds as a source of oxygen. Thus, fuel is readily available for an ozone-based abatement process.

Another problem addressed by the inclusion of ozone in the abatement process is the accumulation of unstable residues on the interior surfaces of the system's exhaust lines. By adding ozone to the effluent stream, it is believed that these unstable residues will be oxidized, thus becoming less reactive. Minimizing the accumulation of residues also reduces problems with clogged exhaust lines. Given the volatile nature of certain of these residues, not only is system throughput increased, but worker safety is also improved. For example, accumulations of silane ($SiH_4$) and condensed polysilanes ($Si_xH_{2x+2}$) are prone to violent combustion. If not abated, these compounds may accumulate within the exhaust lines leading from the combustion chamber and so present a danger to those who clean such equipment. As noted, the high temperatures which exist in the combustion chamber prevent condensation of the water generated by these reactions. The silicon oxide created in such reactions is expected to be in the form of fine, dust-like particles, which would be carried out of the combustion chamber by the flow of gases therein.

B. Ozone-Enhanced Abatement in Systems Using Ozone as a Process Gas

Figure 5:
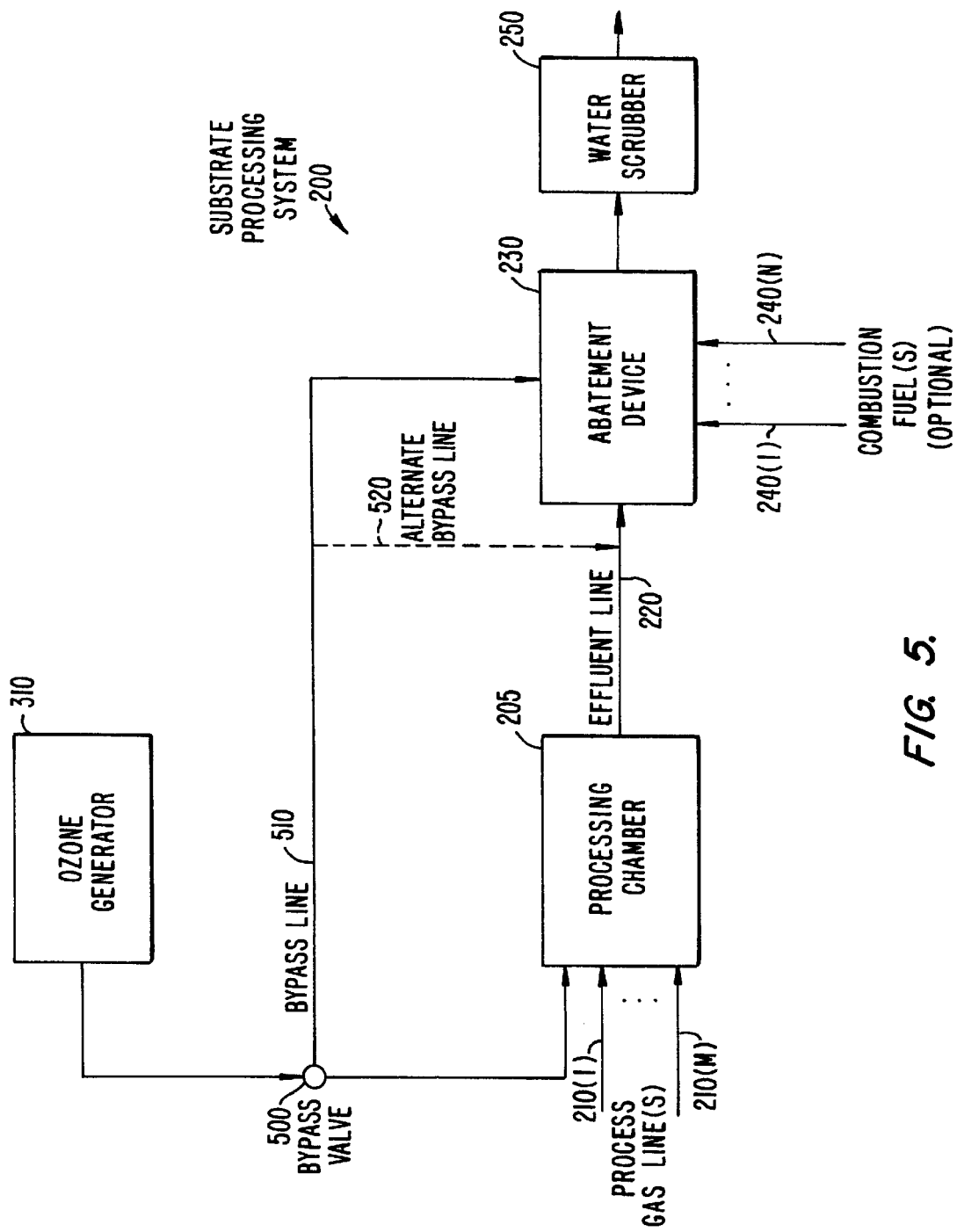
FIG. 5 is a block diagram of a substrate processing system employing a second embodiment of the method of the present invention to abate undesirable compounds in an effluent gas stream.

In substrate processing systems that use ozone as a process gas, the conversion of existing equipment to a configuration employing the method of the present invention provides the aforementioned advantages while offering additional benefits, such as fewer system components and reduced downtime. FIG. 5 shows a second embodiment of substrate processing system 200, which makes use of ozone in the processing of substrates in a manner similar to that of substrate processing system 100 (shown in FIG. 1). In this configuration, ozone generator 310 provides ozone to a bypass valve 500. Bypass valve 500, as noted, is capable of directing the ozone stream to processing chamber 205 and a bypass line 510. Unused ozone directed through bypass line 510 by bypass valve 500 is normally abated using an ozone abatement device.

In a substrate processing system employing the method of the present invention, however, a separate ozone abatement device is not required to abate this unused ozone. In an abatement system of the present invention, unused ozone introduced into the combustion chamber reacts with ozone-reactive compounds present in the effluent stream, as noted. This reaction abates both the compound and the ozone. As has also been noted, ozone may be abated by conversion into oxygen using a thermal process of the type that goes on continuously within abatement device 230. Thus, even when no ozone-reactive compounds are present in the effluent stream, unused ozone introduced into the combustion chamber continues to be abated.

Because systems such as substrate processing system 200 already include an ozone generator, only simple modifications are required to take advantage of the method of the present invention. For example, this might entail connecting bypass line 510 either directly to abatement device 230, or to effluent line 220, via an alternate bypass line 520. However, alternate bypass line 520 should not be used in conjunction with substrate processing operations which employ precursors requiring ozone, such as those which use silane or deposit nitrides. Otherwise, the ozone introduced into effluent line 220 via alternate bypass line 520 could react with any unreacted precursors, forming residues which could clog effluent line 220. The system control software would also need revision to properly control the substrate processing system. The abatement process performed in such a system parallels that described in FIG. 4.

Bypass valve 500 need not simply be binary in nature. For example, bypass valve 500 may direct ozone to abatement device 230 at a minimum flow rate, regardless of the flow rate required in substrate processing operations in processing chamber 205. Another possibility is directing ozone to abatement device 230 only when there is excess ozone to be abated or when the gases supplied to processing chamber 205 require abatement using ozone. In the latter case, an example would be supplying ozone to abatement device 230 during the cleaning of processing chamber 205 using a PFC such as $C_2F_6$. Numerous other configurations for supplying ozone to abatement device 230 would be obvious to one skilled in the art and are intended to be within the scope of the invention described herein.

By employing the method of the present invention, the number of components required in substrate processing system 200 may thus be reduced. Not only does the present invention obviate the need for ozone-specific abatement equipment, equipment used to abate other compounds in the effluent gas stream may also become unnecessary. For example, certain current abatement systems filter out PFCs. When the filter becomes "full" of PFCs, the filter is simply discarded (including the captured PFCs).

Given the capabilities of a process according to the present invention, such a filtering device might be rendered unnecessary, leading to a reduction in the amount of solid waste generated. Without the need to interrupt processing operations (e.g., while a filter is changed), substrate processing system throughput would be increased via a reduction in downtime. Finally, the configuration shown in FIG. 5 not only provides more efficient abatement of the effluent gases created during substrate processing, but also reduces the complexity of the system, leading to a reduction in the number of components employed and an attendant increase in throughput.

The method of the present invention is not intended to be limited by the specific parameters set forth in the above experiments. A person of ordinary skill in the art will realize that different processing conditions and reactant sources can be used without departing from the spirit of the invention. A variety of substrate processing equipment may benefit from the method of the present invention. Other equivalent or alternative methods of using ozone to abate effluent gases created by substrate processing equipment according to the present invention will be apparent to those skilled in the art. These equivalents and alternatives are intended to be included within the scope of the present invention.

What is claimed is:

1. A method for abating an effluent gas exhausted from a substrate processing chamber, said method comprising:

generating an ozone gas while first and second substrate processing chamber operations are performed in said substrate processing chamber;

flowing a first process gas comprising said generated ozone gas into said substrate processing chamber during said first substrate processing chamber operation; and during said second substrate processing chamber operation:

(i) flowing a second process gas comprising at least one of a chlorofluorocarbon, perfluorocarbon or nitrogen oxide gas into said substrate processing chamber, (ii) exhausting said second process gas from said substrate processing chamber into a combustion chamber that is fluidly coupled to said substrate processing chamber, (iii) flowing ozone gas into said combustion chamber by diverting at least a portion of said ozone flow away from said substrate processing chamber to said combustion chamber, and (iv) promoting a reaction in said combustion chamber between said ozone gas and said at least one of a chlorofluorocarbon, perfluorocarbon or nitrogen oxide gas by applying energy to said gases in said combustion chamber.

2. The process of claim 1 wherein said process further comprises flowing hydrogen into said combustion chamber during said second substrate processing chamber operation.

3. The process of claim 1 wherein said energy applied is thermal energy.

4. The process of claim 1 wherein said energy applied is an electric discharge.

5. The process of claim 1 wherein said energy applied is radio frequency energy, and wherein said radio frequency energy creates a plasma from the effluent gas and said ozone.

6. The process of claim 1 wherein said reaction proceeds at a temperature of between about 300° C. and 900° C.

7. The process of claim 1 wherein said ozone is abated in said combustion chamber.

8. The method of claim 1 wherein no ozone is flowed into said substrate processing chamber during said second substrate processing chamber operation.

9. The method of claim 1 wherein said first substrate processing chamber operation is a chemical vapor deposition step and wherein said second substrate processing chamber operation is a chamber clean step.

10. The method of claim 9 wherein said second process gas comprises either a chlorofluorocarbon or a perfluorocarbon gas.

11. The method of claim 1 wherein said ozone gas is generated by an ozone generator that is fluidly coupled to said substrate processing chamber and to said combustion chamber.

12. A process for abating an effluent gas exhausted from a substrate processing chamber, said process comprising the steps of:
  flowing ozone into the substrate processing chamber from an ozone generator fluidly coupled to the substrate processing chamber when said ozone is needed for substrate processing;
  routing said ozone from said ozone generator away from said substrate processing chamber and into said combustion chamber when said ozone is not needed for processing the substrate, wherein said combustion chamber is fluidly coupled to the ozone generator;
  exhausting the effluent gas from said substrate processing chamber into said combustion chamber; and
  applying energy to said ozone and the effluent gas in said combustion chamber to promote a reaction between said ozone and a compound, said compound being selected from the group consisting of chlorofluorocarbons, perfluorocarbons, and nitrogen oxides.

13. A process for abating an effluent gas exhausted from a substrate processing chamber, said process comprising:
  flowing the effluent gas into a combustion chamber fluidly coupled to the substrate processing chamber;
  flowing ozone into said combustion chamber, when said ozone is not needed in a process step being performed in the substrate processing chamber; and
  applying energy to said ozone and the effluent gas in said combustion chamber to promote a reaction between said ozone and a first compound by promoting dissociation of said first compound, thereby producing a second compound which is different from said first compound, wherein said ozone reduces an amount of said energy needed to promote said reaction, wherein said first compound is selected from the group consisting of chlorofluorocarbons, perfluorocarbons, and nitrogen oxides, and said ozone is used in at least one process step performed in the substrate processing system.

14. A process for abating a first compound, said first compound being in an effluent gas exhausted from a substrate processing chamber, said process comprising:
  flowing ozone into the substrate processing chamber from an ozone generator fluidly coupled to the substrate processing chamber when said ozone is needed for substrate processing;
  routing excess ozone from said ozone generator directly into said combustion chamber when said ozone is not needed for processing the substrate, wherein said combustion chamber is fluidly coupled to the ozone generator;
  exhausting the effluent gas from the substrate processing chamber into said combustion chamber; and
  applying energy to said ozone and the effluent gas in said combustion chamber to promote a reaction between said ozone and said first compound by promoting dissociation of said first compound, thereby producing a second compound which is different from said first compound, wherein
    said first compound is selected from the group consisting of chlorofluorocarbons, perfluorocarbons, and nitrogen oxides,
    said ozone reduces an amount of said energy needed to promote said reaction, and
    said excess ozone is abated in said combustion chamber.

15. A substrate processing system comprising:
  a substrate processing chamber, said substrate processing chamber configured to perform first and second substrate processing chamber operations;
  an abatement unit fluidly coupled to said substrate processing chamber; and
  an ozone source, fluidly coupled to said abatement unit and to an inlet of said substrate processing chamber, said ozone source configured to provide ozone to said substrate processing chamber during said first substrate processing chamber operation and configured to provide ozone directly to said abatement unit during said second substrate processing chamber operation, wherein
    said abatement unit is configured to abate a first compound in effluent gases generated in said substrate processing chamber during said second substrate processing chamber operation by virtue of said provision of said ozone to said abatement unit during said second substrate processing operation, and
    said first compound is selected from the group consisting of chlorofluorocarbons, perfluorocarbons, and nitrogen oxides.

16. The apparatus of claim 15 wherein said ozone source is an ozone generator.

17. The apparatus of claim 15 wherein said abatement unit comprises:
  an ignition device for promoting a reaction between said ozone and said first compound, thereby producing a second compound which is different from said first compound.

18. The apparatus of claim 17 wherein said ignition device is a thermal energy source.

19. The apparatus of claim 17 wherein said ignition device is an electrical discharge apparatus.

20. The apparatus of claim 17 wherein said ignition device is a radio frequency energy source, and wherein said radio frequency energy source creates a plasma from said effluent gas and said ozone.

21. An apparatus comprising:

a substrate processing chamber;

a combustion chamber having a first inlet configured to receive an effluent gas exhausted from said substrate processing chamber, a second inlet, and an outlet configured to exhaust a resultant gas;

a source of ozone fluidly coupled to said second inlet and to the substrate processing system, wherein said source is configured to supply said ozone directly to said combustion chamber during one processing step and to the substrate processing chamber during another processing step; and an energy source coupled to said combustion chamber configured to supply energy to said effluent gas and said ozone, wherein a compound in said effluent gas is abated by virtue of a reaction between said compound and said ozone, and the compound is selected from the group consisting of chlorofluorocarbons, perfluorocarbons, and nitrogen oxides.

22. The apparatus of claim 21 wherein said source of ozone is an ozone generator.

23. The apparatus of claim 21 wherein said first inlet and second inlet are the same.

24. The apparatus of claim 21 wherein said energy source is a thermal energy source.

25. The apparatus of claim 21 wherein said energy source is a radio-frequency energy source.

26. A substrate processing system comprising:

an ozone generator;

a substrate processing chamber having an inlet and an outlet;

an abatement device fluidly coupled to the output of the substrate processing chamber;

a first gas line that fluidly couples said ozone generator to said inlet of said substrate processing chamber;

a second gas line that fluidly couples said ozone generator to said abatement device so that ozone generated by said ozone generator can flow from said generator to said abatement device without flowing through said substrate processing chamber; and a valve operatively coupled to said first and second gas lines, wherein said valve can be adjusted to direct ozone flow from said ozone generator to either said first gas line or said second gas line.

27. A substrate processing system having an effluent gas abatement system for abating a first compound in effluent gases generated during the operation of the substrate processing system, wherein the first compound is a compound selected from the group consisting of chlorofluorocarbons, perfluorocarbons, and nitrogen oxides, said substrate processing system comprising:

a substrate processing chamber having an outlet from which effluent gases are exhausted;

an abatement unit coupled to said outlet of said substrate processing chamber for abating said effluent gases; and an ozone source, coupled to an inlet of said abatement unit and to an inlet of said substrate processing system, for providing ozone to said abatement unit, wherein said ozone improves abatement of said effluent gases by reducing an amount of amount of energy required to abate said effluent gases and said ozone is employed in one process step performed in said substrate processing chamber, and is not employed in another process step performed in said substrate processing chamber.

* * * * *